(12) United States Patent
Nakahama et al.

(10) Patent No.: US 7,114,550 B2
(45) Date of Patent: Oct. 3, 2006

(54) COOLING DEVICE FOR HEAT-GENERATING ELEMENTS

(75) Inventors: Takafumi Nakahama, Tokyo (JP); Kenji Kijima, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 283 days.

(21) Appl. No.: 10/212,680

(22) Filed: Aug. 6, 2002

(65) Prior Publication Data

US 2003/0024689 A1 Feb. 6, 2003

(30) Foreign Application Priority Data

Aug. 6, 2001 (JP) .............................. 2001-237789

(51) Int. Cl.
*F28F 7/00* (2006.01)
*H05K 7/20* (2006.01)

(52) U.S. Cl. ............... 165/80.4; 165/80.2; 165/104.33; 361/689; 361/699; 257/714; 62/259.2

(58) Field of Classification Search ............... 165/80.1, 165/80.2, 80.4, 80.5, 104.33, 80.3; 361/688, 361/689, 698, 699, 700, 701; 257/714; 62/259.2
See application file for complete search history.

(56) References Cited

U.S. PATENT DOCUMENTS

| | | | | |
|---|---|---|---|---|
| 4,138,692 A | * | 2/1979 | Meeker et al. ............... | 257/697 |
| 5,021,924 A | * | 6/1991 | Kieda et al. ................. | 361/699 |
| 5,023,695 A | * | 6/1991 | Umezawa et al. .......... | 361/699 |
| 5,050,037 A | * | 9/1991 | Yamamoto et al. ......... | 361/699 |
| 5,263,536 A | * | 11/1993 | Hulburd et al. ............ | 165/80.4 |
| 5,264,984 A | * | 11/1993 | Akamatsu ................... | 165/80.4 |
| 5,265,670 A | * | 11/1993 | Zingher ...................... | 165/80.4 |
| 5,269,372 A | * | 12/1993 | Chu et al. ................... | 165/80.4 |
| 5,294,830 A | * | 3/1994 | Young et al. ................ | 361/699 |
| 5,309,319 A | * | 5/1994 | Messina ...................... | 165/80.4 |
| 5,394,299 A | * | 2/1995 | Chu et al. ................... | 165/80.4 |
| 5,563,768 A | * | 10/1996 | Perdue ........................ | 165/80.3 |
| 5,737,186 A | * | 4/1998 | Fuesser et al. .............. | 361/699 |
| 5,768,103 A | * | 6/1998 | Kobrinetz et al. .......... | 361/699 |
| 5,835,345 A | * | 11/1998 | Staskus et al. .............. | 361/699 |
| 6,029,742 A | * | 2/2000 | Burward-Hoy ............. | 165/80.4 |
| 6,060,966 A | * | 5/2000 | Tennant et al. ............. | 165/80.4 |
| 6,104,610 A | * | 8/2000 | Tilton et al. ................ | 361/698 |
| 6,349,554 B1 | * | 2/2002 | Patel et al. .................. | 165/80.4 |
| 6,366,462 B1 | * | 4/2002 | Chu et al. ................... | 361/699 |
| 6,404,640 B1 | * | 6/2002 | Ishimine et al. ............ | 361/701 |
| 6,431,260 B1 | * | 8/2002 | Agonafer et al. ........... | 257/714 |
| 6,842,340 B1 | * | 1/2005 | Chang ........................ | 361/695 |

FOREIGN PATENT DOCUMENTS

JP 10-22428 1/1998

* cited by examiner

*Primary Examiner*—Ljiljana Ciric
(74) *Attorney, Agent, or Firm*—Foley & Lardner LLP

(57) ABSTRACT

A cooling device for cooling heat generating elements in which a cooling effect is produced by collision of a coolant with the back face side of heat-generating elements (1). The coolant (10) is introduced into a coolant introduction chamber (3) within a first coolant contact chamber (4) and is then introduced into the first coolant contact chamber (4) by injection from a central nozzle (7). Thereafter the coolant (10) produces a cooling effect in a second coolant contact chamber (5) and in a third coolant contact chamber (6). Since peripheral nozzles (8) and (9) are formed so as to spread in radial fashion about central nozzle (7), uniform cooling of the back face side of the heating-generating elements (1) is observed. As a result, there is no possibility of large tensile heat stress being generated at the heat-generating elements (1).

17 Claims, 15 Drawing Sheets

CHECKERBOARD ARRANGEMENT

ZIGZAG ARRANGEMENT

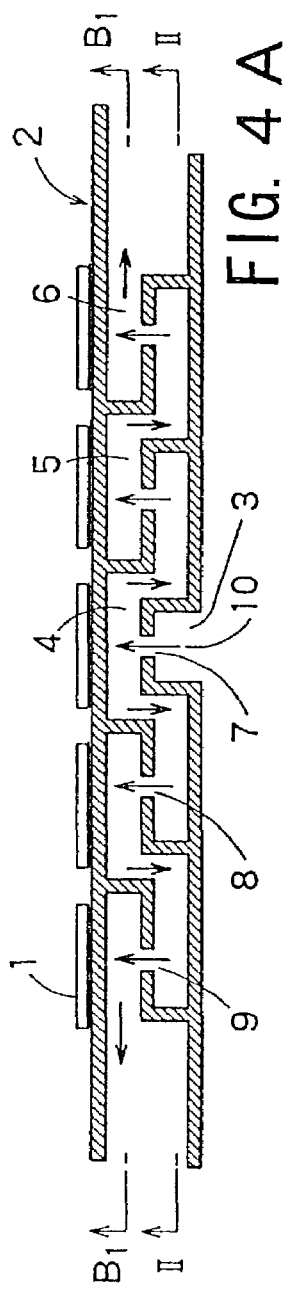
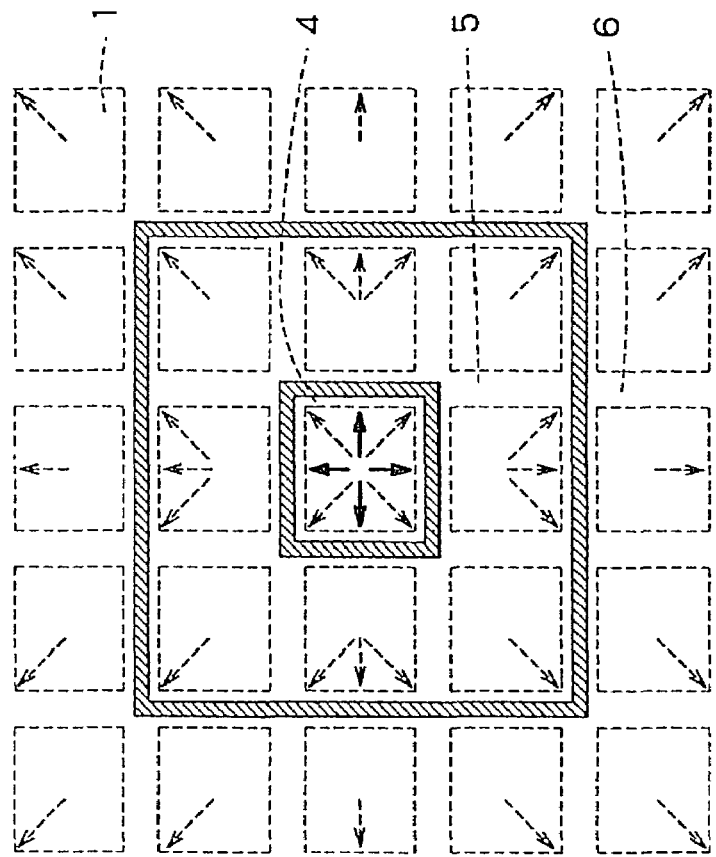
FIG. 4A
FIG. 4B

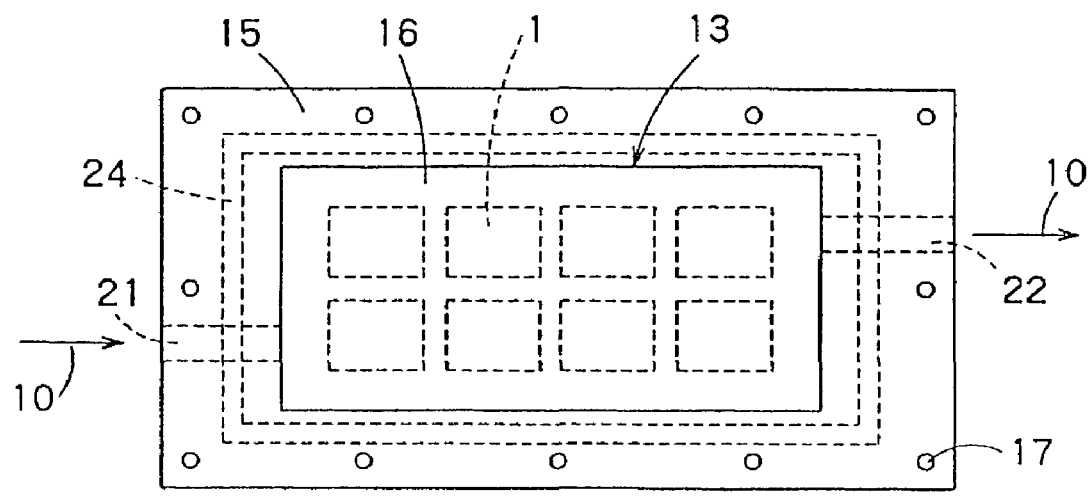
FIG. 1 1 A
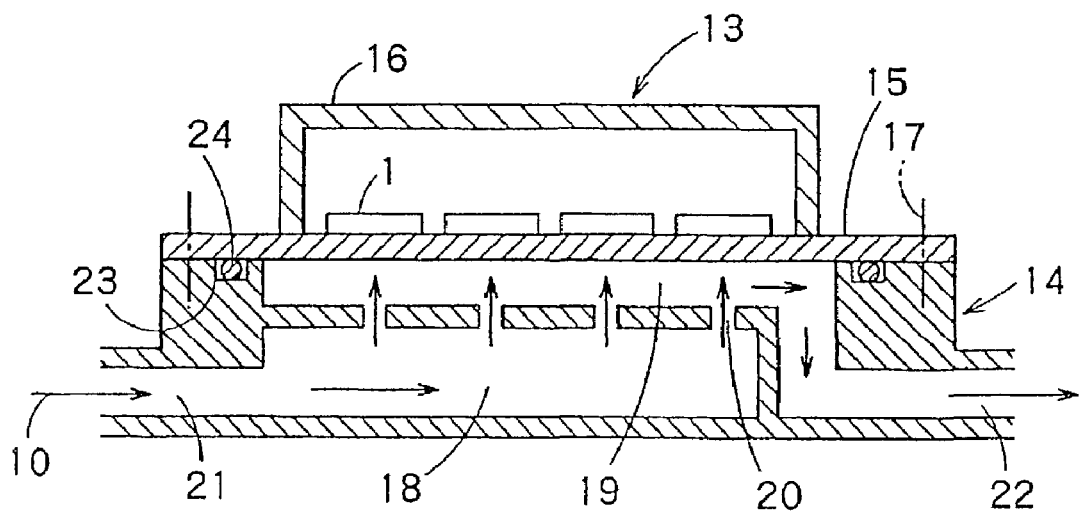
FIG. 1 1 B

COOLING DEVICE FOR HEAT-GENERATING ELEMENTS

CROSS-REFERENCE TO RELATED APPLICATION

This application claims benefit of priority to Japanese Application number JP 2001-237789 filed Aug. 6, 2001, the entire content of which is incorporated by reference herein.

BACKGROUND OF THE INVENTION

1. Field of the Invention

The present invention relates to a cooling device for heat-generating elements that performs cooling of heat-generating elements by heat exchange action with a coolant.

2. Description of the Related Art

Semiconductor elements such as IGBTs are employed in equipment of various types including in particular power converters such as inverters. These semiconductor elements generate heat during operation of the equipment and so constitute heat-generating elements whose temperature rises to a considerable degree. A prescribed value (rating) is laid down in respect of the heat endurance temperature of these semiconductor elements, so rise of temperature above a fixed value must be prevented by cooling the semiconductor elements during operation of the equipment. Whether or not efficient cooling of the semiconductor elements can be achieved is therefore extremely important in regard to the performance of the equipment.

FIG. 1A and FIG. 1B are diagrams illustrating the layout of a conventional cooling device for a heat-generating element, FIG. 1A being a plan view and FIG. 1B being a cross-sectional view. In these Figures, heat-generating elements 101 are arranged in checkerboard (sometimes called "go" in Japanese) fashion on the surface of a heat sink 102. Heat sink 102 is formed of material of good thermal conductivity such as copper or aluminum and is formed with coolant passages 103 that have bending points at a plurality of locations in its interior.

Thus, when coolant 106 (for example a liquid such as water) is delivered from a coolant inlet 104, this coolant 106 advances in meandering fashion through the interior of coolant passage 103 so that cooling of the heat-generating elements 101 is performed in uniform fashion by the heat exchanging action of coolant 106 during this advance. After this heat exchanging has been completed, the coolant 106 is then discharged from coolant outlet 105 to outside heat sink 102.

It should be noted that, although in this prior art, the case was illustrated in which heat-generating element 101 were arranged in checkerboard fashion, heat-generating elements 101 could be arranged in a zigzag fashion. FIG. 2A and FIG. 2B are diagrams illustrating the differences between the checkerboard arrangement and the zigzag arrangement. In the checkerboard arrangement, as shown in FIG. 2A, the positions of heat-generating elements 101 are in an aligned arrangement in each column and each row; in the zigzag arrangement shown in FIG. 2B, the positions of heat-generating elements 101 in a given row and the positions of heat-generating elements 101 in the adjacent row are offset.

FIG. 3A and FIG. 3B are diagrams illustrating the arrangement of a conventional device different from that of FIG. 1A and FIG. 1B, FIG. 3A being a cross-sectional view in the front elevation direction and FIG. 3B being a cross-sectional view in the side direction. In these Figures, heat-generating elements 101 are incorporated as structural elements of module elements 107, and are arranged on a plate member 108. The periphery of a heat-generating element 101 is covered by a cover member 109 and the peripheral region of plate member 108 is mounted on heat sink 102 by means of mounting screws 110. In the same way as in the case of the prior art of FIG. 1A and FIG. 1B, the heat sink 102 performs cooling of heat-generating elements 101 by means of coolant 106, being formed with heat radiating fins 111 and a channel 112 constituting a passage for coolant 106.

Thus, in the cooling device shown in FIG. 3A and FIG. 3B, when the coolant 106 is fed in from coolant inlet 104, this coolant 106 advances through channel 112 between heat radiating fins 111 and cooling of the heat-generating elements 101 is uniformly effected by the heat exchange action of coolant 106 during this advance.

Although, as mentioned above, cooling of the heat-generating elements 101 is performed uniformly by the heat exchange action of cooling medium 106 flowing through the interior of heat sink 102, not withstanding this uniformity a certain degree of temperature difference is produced between portions where passage for coolant 106 is provided and portions other than these, so complete uniformity is not achieved.

Furthermore, with a conventional cooling device, the coolant 106 advances through coolant passages 103 or channels 112, so a certain time is unavoidably required for it to reach coolant outlet 105 from coolant inlet 104. Transiently, therefore, a large temperature difference can be produced between portions that have been reached by coolant 106 and portions that have not yet been reached thereby. For example, the distance of the two points P1 and P2 shown in FIG. 1A is short since these are positions on mutually adjacent heat-generating elements 101. However, since coolant passage 103 is of a meandering shape, even though the portion of point P1 is cooled by coolant 106, the portion of point P2 is still not yet cooled, so a condition in which there is a large temperature difference between the two points is produced. A large tensile heat stress is thereby generated between these, with the result that this heat stress is applied to the heat-generating element 101 also.

SUMMARY OF THE INVENTION

Accordingly, one object of the present invention is to provide a novel cooling device for heat-generating elements wherein cooling by the coolant is performed uniformly even under transient conditions and it is thereby possible to prevent application of large thermal stress to the heat-generating elements.

In order to achieve the above object, the present invention is constructed as follows. Specifically, the cooling device for heat-generating elements comprises:

(1) a surface section wherein a plurality of heat-generating elements are arranged in practically radial fashion; and (2) a heat sink that performs cooling of the heat-generating elements by flow of coolant in a coolant passage formed in the interior of the surface section;

wherein the heat sink comprising:

(a) a coolant introduction chamber that performs introduction of coolant from a coolant inlet formed in the coolant passage;

(b) a coolant contact chamber formed in the coolant passage and that brings coolant from the coolant introduction chamber into contact with the back face side of a location where said heat-generating elements are arranged; and (c) a nozzle for injecting the coolant towards the back face side, between the coolant introduction chamber and the coolant contact chamber adjacent thereto.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein:

FIG. 4A and FIG. 4B are views given in explanation of the construction of a first embodiment of the present invention, FIG. 4A being an axial (longitudinal or vertical) cross-sectional view and FIG. 4B being a view in the direction of the arrows B1—B1 of FIG. 4A;

FIG. 11A and FIG. 11B are views given in explanation of the construction of a seventh embodiment of the present invention, FIG. 11A being a plan view and FIG. 11B a vertical cross-sectional view;

DETAILED DESCRIPTION OF THE PREFERRED EMBODIMENTS

Figure 1:
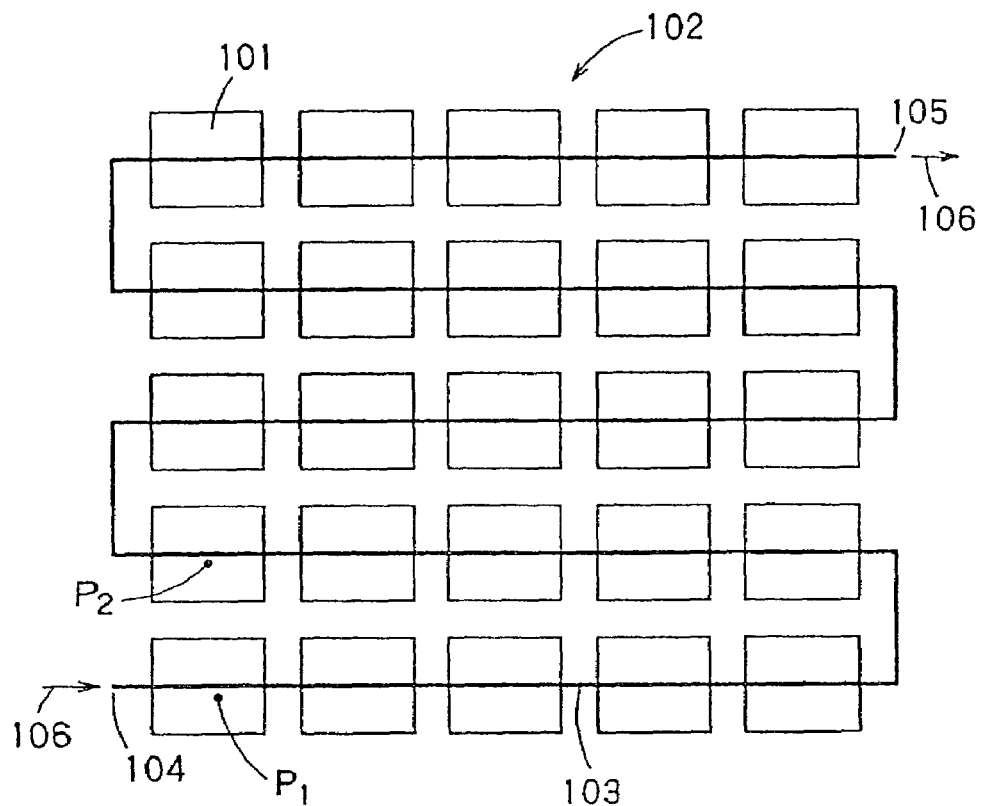
FIG. 1A and FIG. 1B are diagrams illustrating the construction of a conventional cooling device for heat-generating elements, especially FIG. 1A being a plan view and FIG. 1B a cross-sectional view.
Figure 1:
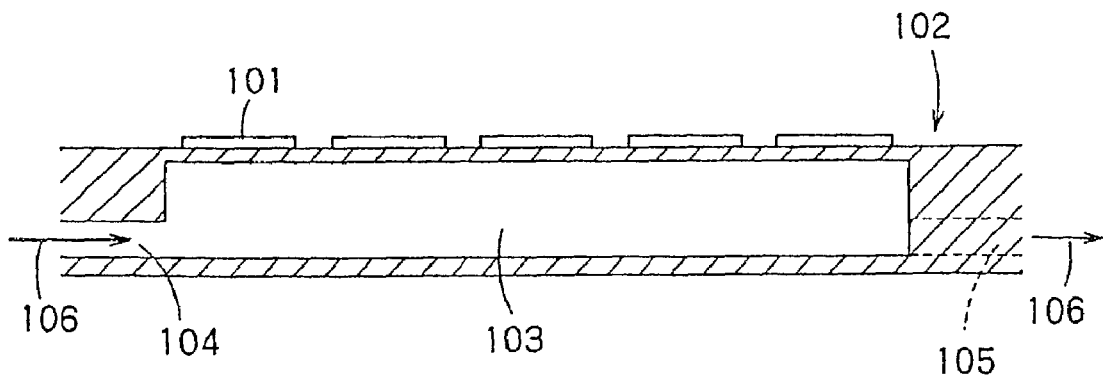
Figure 2A:
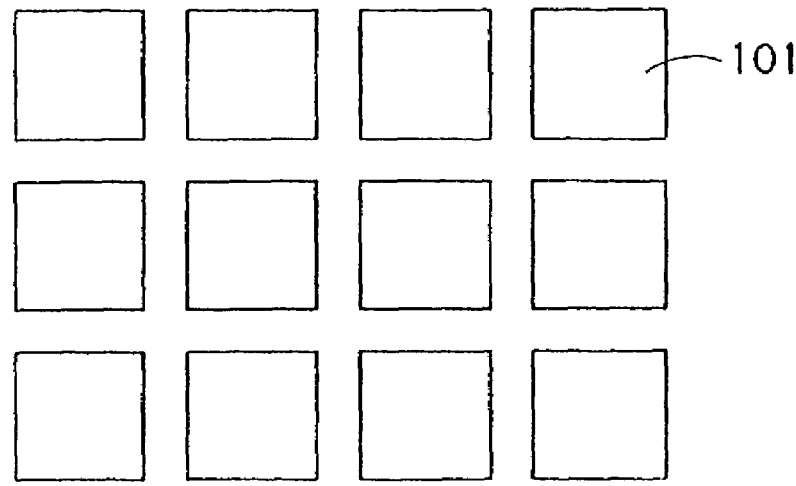
FIG. 2A and FIG. 2B are views given in explanation of the differences between a checkerboard arrangement and a zigzag arrangement.
Figure 2B:
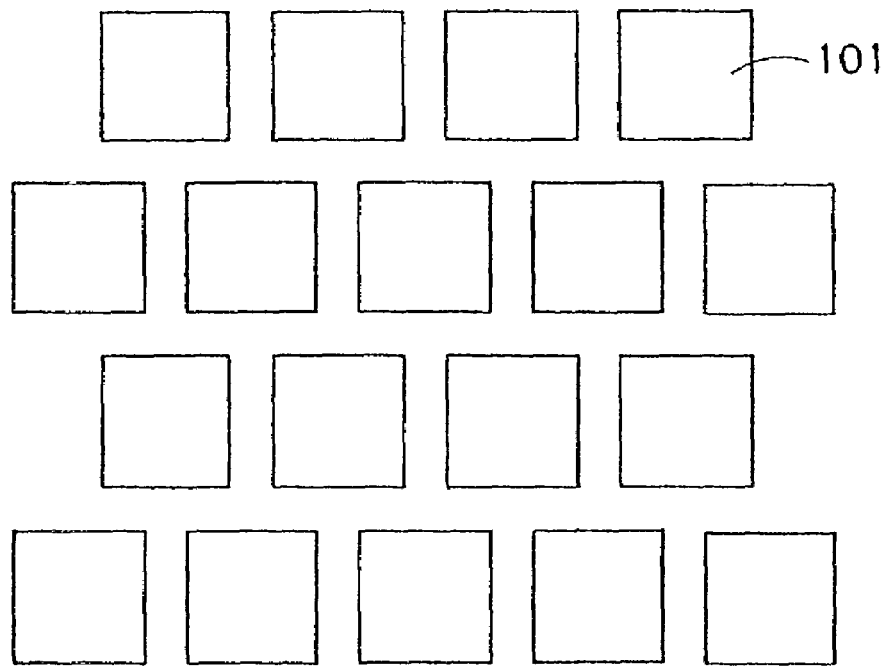
Figure 3:
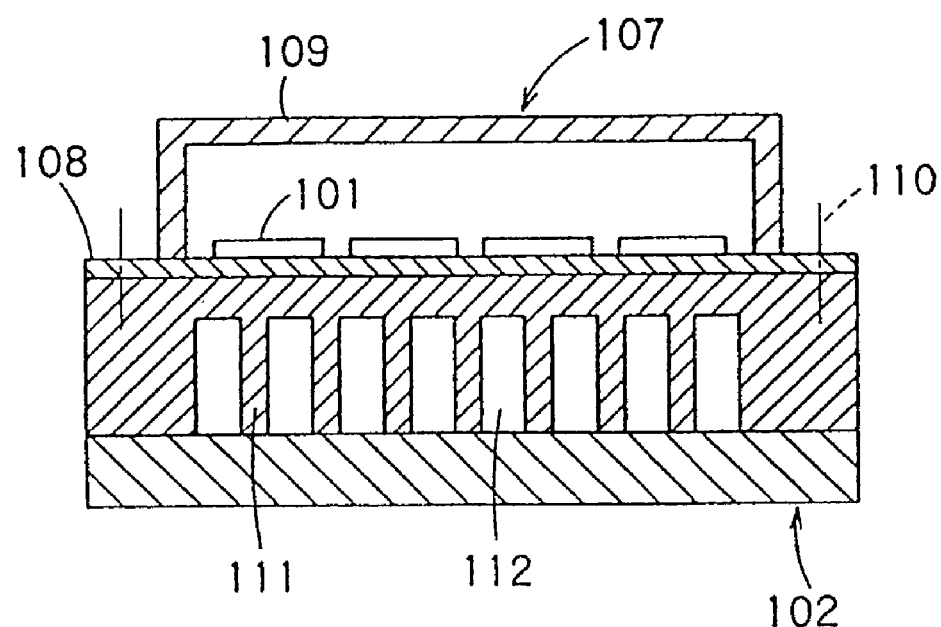
FIG. 3A and FIG. 3B are diagrams illustrating the construction of a further prior art device, FIG. 3A being a cross-sectional view in the front elevation direction and FIG. 3B being a cross-sectional view in the lateral direction.
Figure 3:
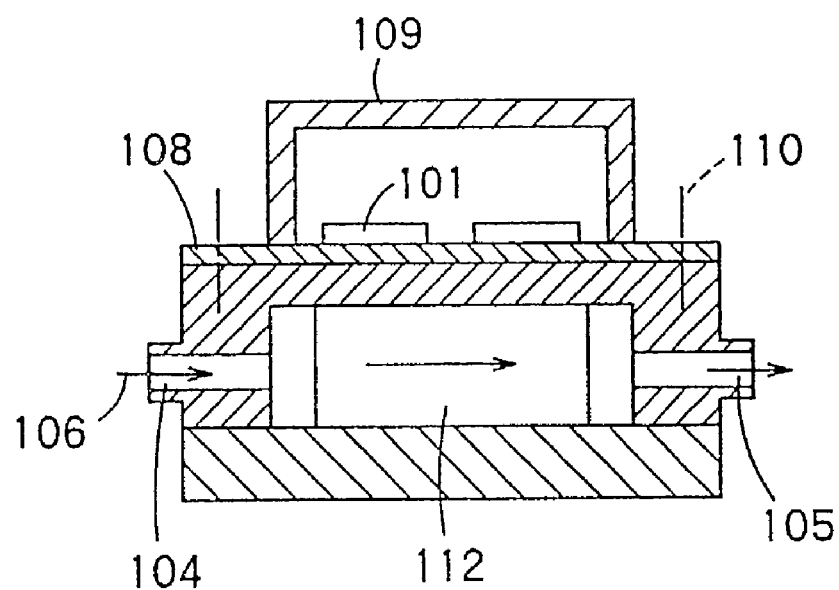

Referring now to the drawings, wherein like reference numerals designate identical or corresponding parts throughout the several views, and more particularly to FIGS. 4–16 thereof, one embodiment of the present invention will be described.

Figure 5:
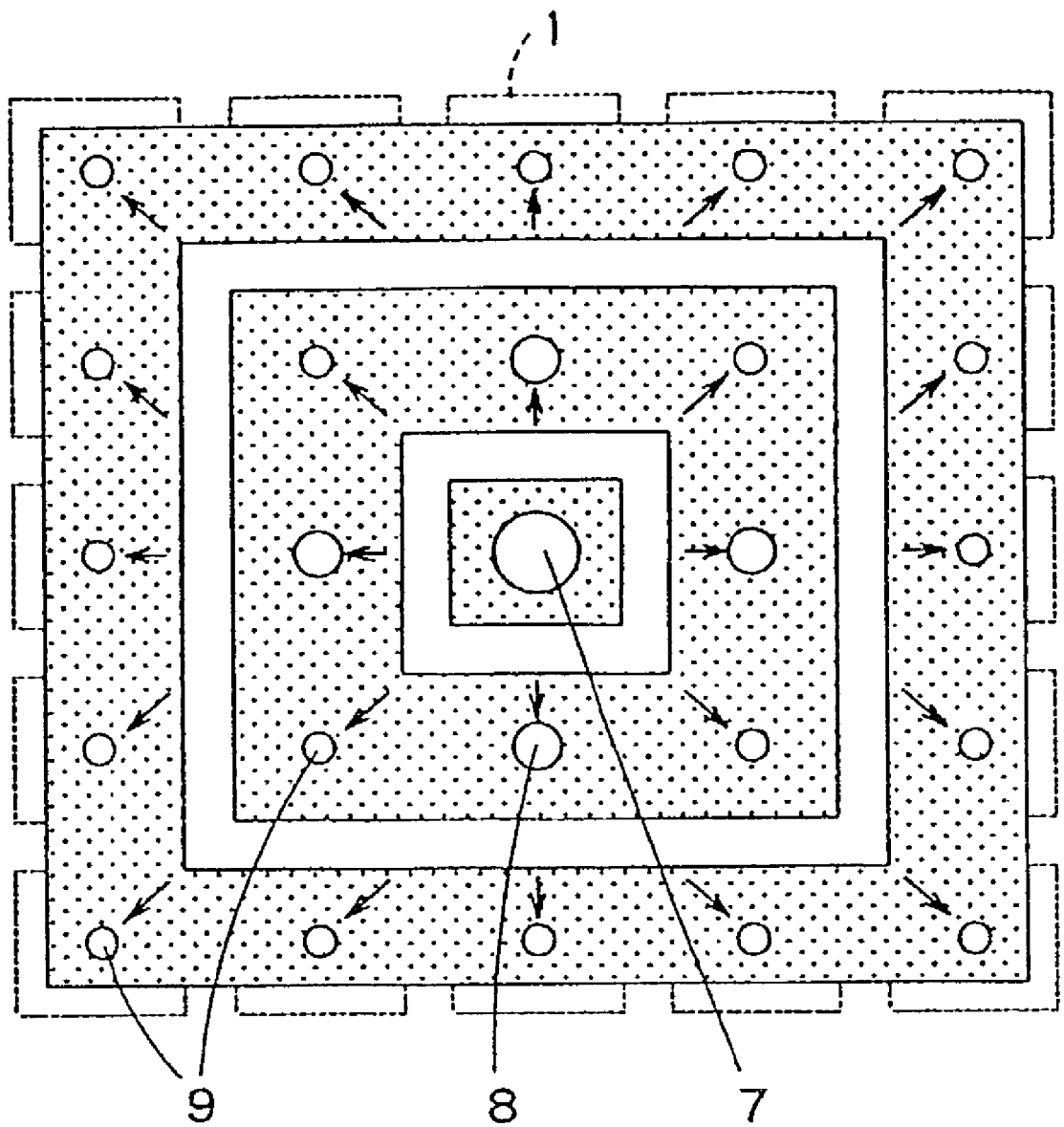
FIG. 5 is a view in the direction of the arrows II—II of FIG. 4A.

FIG. 4A and FIG. 4B are views given in explanation of the construction of a first embodiment of the present invention, FIG. 4A being a vertical cross-sectional view and FIG. 4B being a view in the direction of the arrows B1—B1 of FIG. 4A. FIG. 5 is a view in the direction of the arrows II—II of FIG. 4A.

In these Figures, a plurality of heat-generating elements 1 are arranged in checkerboard fashion on the surface on one side of a heat sink 2. As shown in FIG. 4A, a coolant introduction chamber 3 is formed below a central heat-generating element 1 (hereinbelow, for convenience in description, directions are indicated by "upwards" or "downwards", but the actual heat sink 2 could be mounted in many different orientations, so these terms refer only to its shape in the drawings rather than its actual physical orientation). A first coolant contact chamber 4 is formed so as to surround this coolant introduction chamber 3; a second coolant contact chamber 5 is formed so as to surround this first coolant contact chamber 4 and a third coolant contact chamber 6 is formed so as to surround this second coolant contact chamber 5.

A single central nozzle 7 is formed between the coolant introduction chamber 3 and coolant contact chamber 4 so as to be positioned in a central position of these chambers. Also, a plurality of peripheral nozzles 8 of diameter smaller than central nozzle 7 are formed between first coolant contact chamber 4 and second coolant contact chamber 5. In addition, a plurality of peripheral nozzles 9 of diameter even smaller than the diameter of peripheral nozzles 8 are formed between the second coolant contact chamber 5 and third coolant contact chamber 6.

FIG. 5 is a view given in explanation of the magnitudes of the respective diameters of the above nozzles 7 to 9 and their mutual positional relationships. As shown in this Figure, the central nozzle 7 that is formed between coolant introduction chamber 3 and first coolant contact chamber 4 is of the largest diameter; the peripheral nozzles 8 that are formed between first coolant contact chamber 4 and second coolant contact chamber 5 have the next largest diameter, while the peripheral nozzles 9 that are formed between second coolant contact chamber 5 and third coolant contact chamber 6 have the smallest diameter. The plurality of peripheral nozzles 8, 9 are formed so as to be positioned in radial fashion about central nozzle 7 as center. It should be noted that, although both peripheral nozzles 8 of second largest diameter and peripheral nozzles 9 of smallest diameter are present between first coolant contact chamber 4 and second coolant contact chamber 5, the positions of peripheral nozzles 9 are further from central nozzle 7 than the positions of peripheral nozzles 8. A relationship is thereby established such that the diameter of the peripheral nozzles becomes progressively smaller as distance from the central nozzle 7 is increased.

Next, the action of the first embodiment constructed as above will be described. When coolant 10 is fed from a coolant inlet, not shown, this coolant 10 is introduced into coolant introduction chamber 3 so that the interior of coolant introduction chamber 3 becomes filled with coolant 10. Coolant 10 is injected from central nozzle 7 towards the back face side of the heat sink 2 where the heat-generating elements 1 are arranged.

Coolant 10 injected from central nozzle 7 straight away fills the interior of first coolant contact chamber 4 and is injected towards the back face side of second coolant contact chamber 5 from peripheral nozzles 8 (and peripheral nozzles 9). Furthermore, the coolant 10 injected from peripheral nozzles 8 straight away fills second coolant contact chamber 5 and is injected towards the back face side within third coolant contact chamber 6 from peripheral nozzles 9. After this, coolant 10 that has filled the third coolant contact chamber 6 is delivered to a coolant outlet, not shown, whence it is discharged to outside heat sink 2.

The arrows in FIG. 4A, FIG. 4B and FIG. 5 indicate the direction of flow of coolant 10. That is, cooling of heat-generating elements 1 is effected by performing heat exchange wherein coolant 10 is introduced into coolant introduction chamber 3 from the coolant inlet and then is sequentially fed to first coolant contact chamber 4, second coolant contact chamber 5 and third coolant contact chamber 6, being thereby brought into contact with the back face side of heat sink 2 where the heat-generating elements 1 are arranged.

In this case, in FIG. 4A, tensile stress due to thermal stress does act on the heat-generating element 1 positioned directly above coolant introduction chamber 3 and central nozzle 7 but, since peripheral nozzles 8 and 9 are formed so as to spread in radial fashion about central nozzle 7 as center, cooling of the peripheral heat-generating elements 1 is likewise performed in a manner spreading in radial fashion. Consequently, since the peripheral heat-generating elements 1 are not deformed since they are not yet cooled, the tensile stress is uniformly distributed in the circumferential direction. Also, since the cooling range spreads in radial fashion from the central nozzle 7 as center, the cooling region is practically uniformly distributed in the circumferential direction, so, even in the transitional period, there is no possibility of large tensile heat stress being generated on the heat-generating elements 1 relative to the peripheral heat-generating elements and there is no possibility of heat-generating elements 1 being damaged by heat stress.

The reason why the aperture (hole diameter) of central nozzle 7 and peripheral nozzles 8 and 9 is made progressively larger approaching the middle and progressively smaller approaching the periphery will now be described. In this embodiment, the hole diameter is made progressively larger for nozzles nearer to the center so their flow rates are higher, making it possible to equalize the average outflow speed of the jets from the nozzles. If we now assume that the mean outflow speed of the jet is u and the heat transfer factor at the impact point with which this jet collides is α, the relationship between α and u can be expressed by the following expression (1) (see: Mechanical Association of Japan, Heat Transfer Engineering Data, 4th edition p 66 (66)). In expression (1), λ is the fluid thermal conductivity, D is the hole diameter, Pr is the Prandtl number, Red is the Reynold's number and the Reynold's number Red can be expressed by expression (2), where the coefficient of fluid dynamic viscosity is v. Furthermore, if the flow rate is Q, the mean outflow velocity u in expression (2) can be expressed by expression (3).

$$\alpha = \lambda/D * 0.94 * P_r^{0.4} Red^{0.5} \quad (1)$$

$$Red = uD/v \quad (2)$$

$$U = (\pi D^2/4)/Q \quad (3)$$

As a result, from the above expression (1) to the expression (3), it can be seen that the heat transfer factor a is proportional to D/Q raised to the power 0.5. Consequently, the heat transfer factor at the back face side, with which the jet collides, of each heat-generating element 1 can be made practically the same by making the whole diameter of the central nozzle 7 where the flow rate is concentrated large and by making the hole diameter of the peripheral nozzles where the flow rate is distributed small. For such reasons, the hole diameter of the nozzles is made progressively larger towards the middle and progressively smaller towards the periphery.

It should be noted that although, in the first embodiment, the case where the number of coolant contact chambers is three was described, this number of coolant contact chambers could be any number of two or more.

The construction of a second embodiment of the present invention is described with reference to FIG. 6A and FIG. 6B, FIG. 6A being a vertical cross-sectional view and FIG. 6B being a view along the arrows B2—B2 of FIG. 6A. This embodiment shows the case where heat-generating elements 1 are arranged on two faces on both sides of heat sink 2.

Figure 6A:
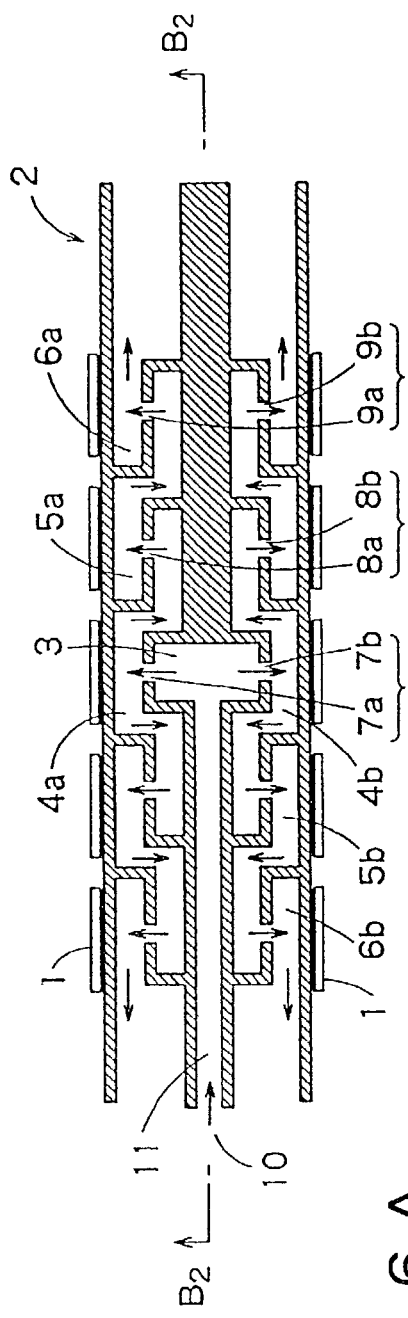
FIG. 6A and FIG. 6B are views given in explanation of the construction of a second embodiment of the present invention, FIG. 6A being a vertical cross-sectional view and FIG. 6B being a view in the direction of arrows B2—B2 of FIG. 6A.
Figure 6B:
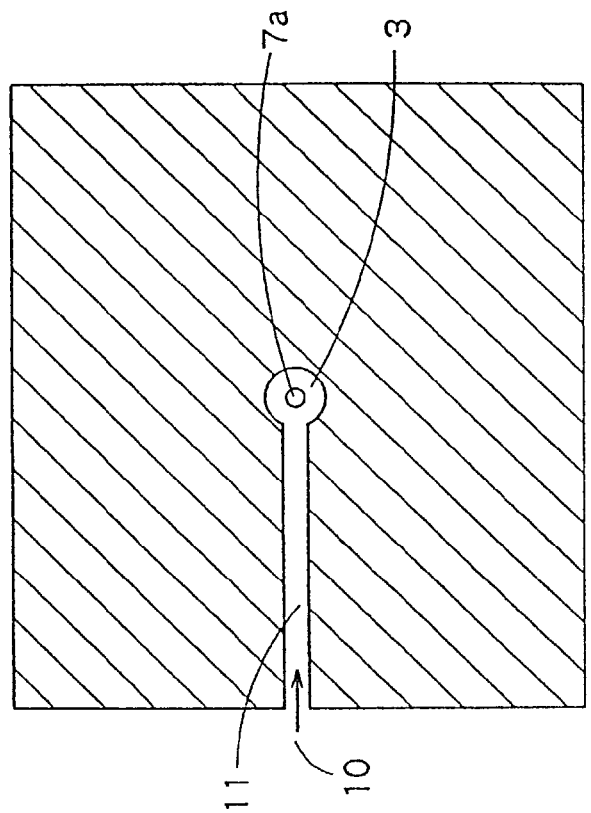

Specifically, in FIG. 6A, one end of a passage 11 is connected to a coolant inlet, not shown, while the other end of this passage 11 is connected to a coolant introduction chamber 3. First coolant contact chambers 4a, 4b are formed so as to surround this coolant introduction chamber 3; second coolant contact chambers 5a, 5b are formed so as to surround these first coolant contact chambers 4a, 4b and third coolant contact chambers 6a, 6b are formed so as to surround these second coolant contact chambers 5a, 5b.

Central nozzles 7a, 7b are formed between the coolant introduction chamber 3 and first coolant contact chambers 4a, 4b so as to be positioned in central positions of these chambers. Also, peripheral nozzles 8a, 8b of diameter smaller than central nozzles 7a, 7b are formed between first coolant contact chambers 4a, 4b and second coolant contact chambers 5a, 5b. In addition, peripheral nozzles 9a, 9b of diameter even smaller than the diameter of peripheral nozzles 8a, 8b are formed between the second coolant contact chambers 5a, 5b and third coolant contact chambers 6a, 6b.

The action of the second embodiment is the same as that of the first embodiment, so description thereof will not be repeated. In the second embodiment, just as in the case of the first embodiment, uniform cooling of the heat-generating elements 1 can be performed and large tensile heat stress can be prevented from being generated at heat-generating elements 1. Also, in this second embodiment, since passage 11 is only in contact with one side of coolant introduction chamber 3, a flow of speed distribution of practically parabolic shape is produced that is stable towards the central nozzles 7A, 7B in this passage 11.

Figure 7A:
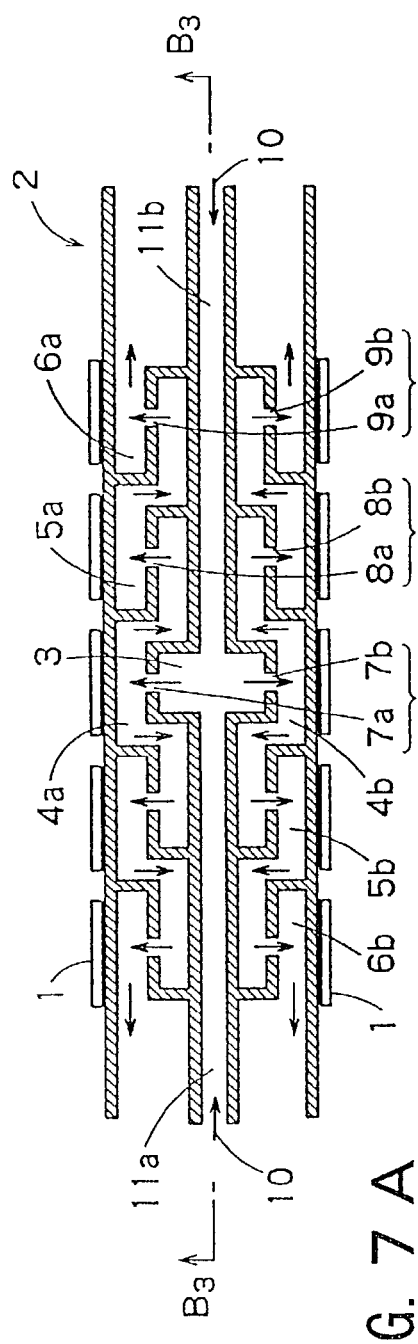
FIG. 7A and FIG. 7B are views given in explanation of the construction of a third embodiment of the present invention, FIG. 7A being a vertical cross-sectional view and FIG. 7B being a view in the direction of the arrows B3—B3 of FIG. 7A.
Figure 7B:
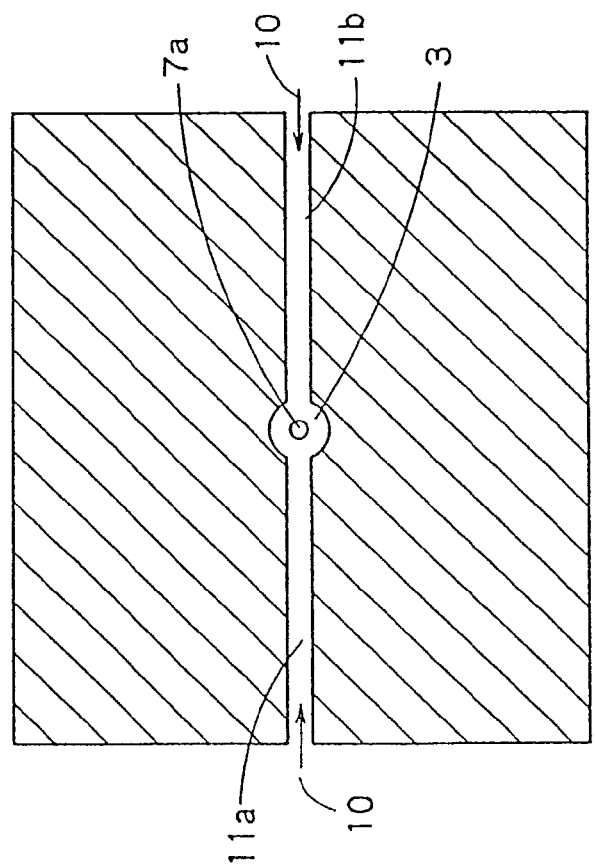

FIG. 7A and FIG. 7B are views given in explanation of the construction of a third embodiment of the present invention, FIG. 7A being a vertical cross-sectional view and FIG. 7B being a view in the direction of the arrows B3—B3 of FIG. 7A. In this third embodiment, just as in the case of the second embodiment, a construction is illustrated in which heat-generating elements 1 are arranged on two outer surfaces on both sides of heat sink 2; however, unlike the second embodiment, two passages 11a, 11b are connected to both sides of coolant introduction chamber 3. The flow rate of coolant 10 from the coolant inlet to coolant introduction chamber 3 can thereby be made larger than in the case of the second embodiment.

Figure 8:
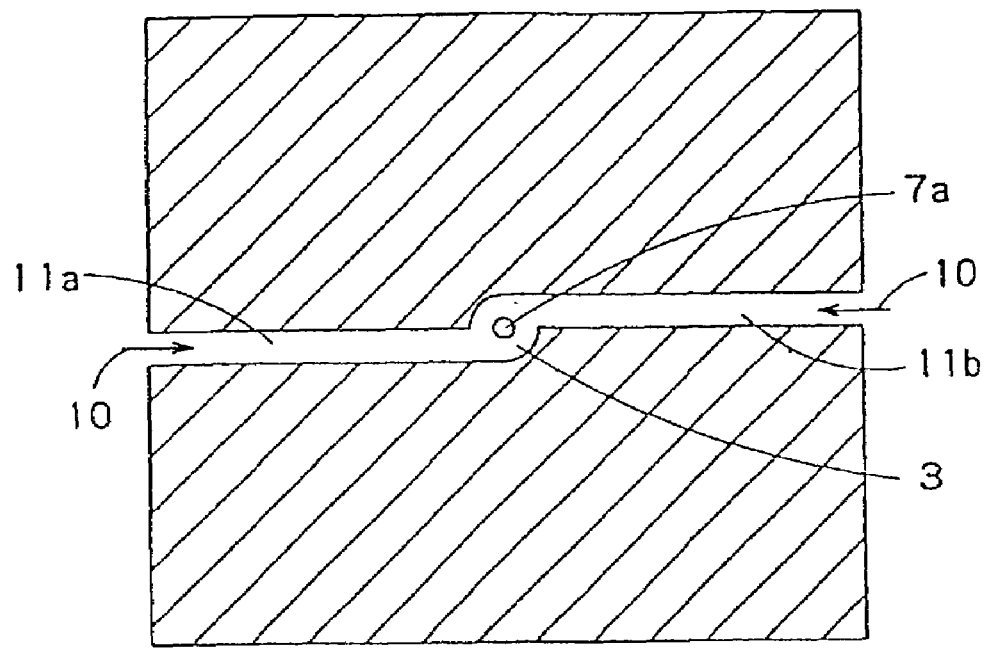
FIG. 8 is a transverse cross-sectional view given in explanation of the construction of major parts of a fourth embodiment of present invention.

FIG. 8 is a transverse cross-sectional view corresponding to FIG. 7B given in explanation of the construction of major parts of a fourth embodiment of the present invention. In the case of FIG. 7B, since the introduction ports of the two passages 11a, 11b are positioned facing each other, coolant 10 flowing through these passages collides in the coolant introduction chamber 3, reducing the flow speed within coolant introduction chamber 3. However, in the case of FIG. 8, the introduction ports of the two passages 11a, 11b are in mutually offset positions, so coolant 10 flowing through each passage has a vortical speed component in the coolant introduction chamber 3, so no large reduction in the flow speed takes place. The heat transfer factor at the location where the jet collides with the back face side of the heat-generating elements 1 can therefore be increased.

Figure 9:
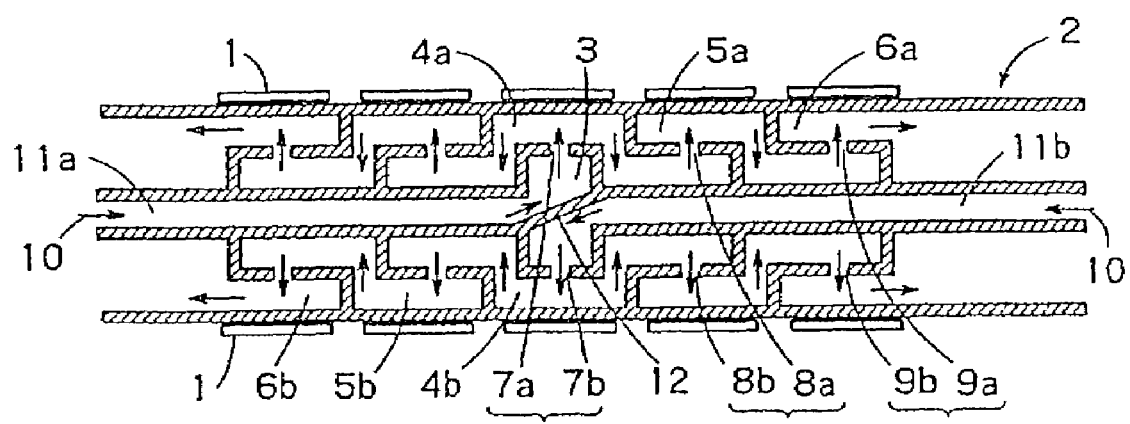
FIG. 9 is a vertical cross-sectional view illustrating the construction of major parts of a fifth embodiment of the present invention.

FIG. 9 is a vertical cross-sectional view corresponding to FIG. 7A illustrating the construction of major parts of a fifth embodiment of the present invention. Specifically, in this embodiment, a partition 12 for partitioning coolant 10 flowing from passage 11a and coolant 10 flowing from passage 11b into coolant introduction chamber 3 is formed in an inclined fashion with respect to the respective inflow directions. The coolant 10 from the respective passages is therefore injected from central nozzles 7A, 7B in a condition wherein little loss of pressure is created, since mutual collision within coolant introduction chamber 3 cannot occur.

Figure 10A:
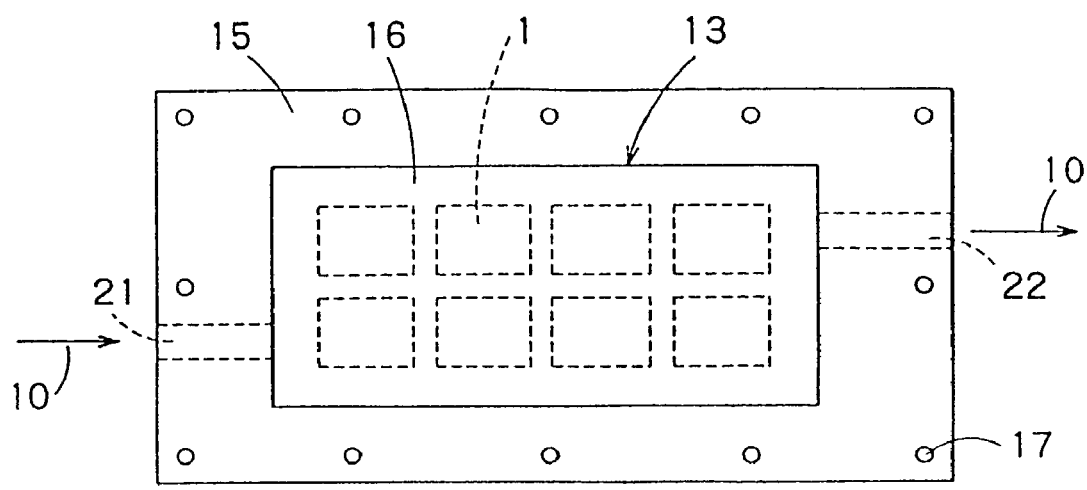
FIG. 10A and FIG. 10B are views given in explanation of the construction of a sixth embodiment of the present invention, FIG. 10A being a plan view and FIG. 10B a vertical cross-sectional view.
Figure 10B:
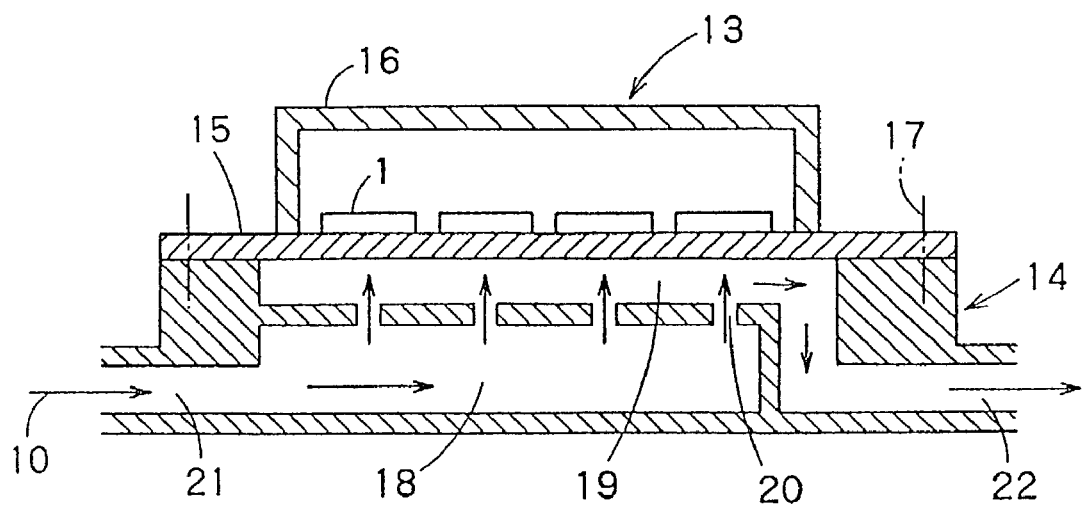

FIG. 10A and FIG. 10B are views given in explanation of the construction of a sixth embodiment of the present invention, FIG. 10A being a plan view and FIG. 10B a vertical cross-sectional view. In this embodiment, a module type element 13 is incorporated in heat sink 14 and heat-generating elements 1 are incorporated as constituent elements of module type element 13. A plurality of heat-generating elements 1 are arranged on the surface of a plate member 15 so as to constitute overall a practically rectangular shape, the periphery of these heat-generating elements 1 being covered by a cover member 16. Plate member 15 is mounted on heat sink 14 by mounting screws 17 in the vicinity of the peripheral region thereof.

A coolant introduction chamber 18 and coolant contact chamber 19 are formed in the interior of heat sink 14, a plurality of nozzles 20 being formed between these chambers. Coolant contact chamber 19 has a practically rectangular-shaped face including the back face side of all of the heat-generating elements 1; this coolant contact chamber 19 and coolant introduction chamber 18 have faces of practically the same shape. Also, the plurality of nozzles 20 have mutually identical diameters.

In this sixth embodiment, the overall shape of heat-generating elements 1 is practically rectangular and they have a comparatively small area, so a single coolant contact chamber 19 is sufficient, cooling of all of the heat-generating elements 1 being performed by coolant 10 within this coolant contact chamber 19. In this case, coolant 10 flowing in from coolant inlet 21 immediately fully fills coolant introduction chamber 18 and jets are injected from nozzles 20. Injection from nozzles 20 is then performed practically simultaneously, so there is no possibility of tensile heat stress being generated between heat-generating elements 1.

FIG. 11A and FIG. 11B are views given in explanation of the construction of a seventh embodiment of the present invention, FIG. 11A being a plan view and FIG. 11B a vertical cross-sectional view. The respect in which FIG. 11A and FIG. 11B differ from FIG. 10A and FIG. 10B is that an annular groove 23 is formed in the opposite face of heat sink 14 facing plate member 15, and an O-ring 24 is embedded in this annular groove 23. This O-ring 24 is pressed into contact with heat sink 14 by plate member 15 by the tightening force when plate member 15 is tightened on to heat sink 14 by mounting screws 17.

In this way, with this embodiment, since an annular groove 23 is formed in the vicinity of the wall of heat sink 14 that forms the coolant contact chamber 19 and an O-ring 24 is arranged within this annular groove 23, high cooling performance can be maintained without leakage of coolant 10 from coolant contact chamber 19.

Figure 12A:
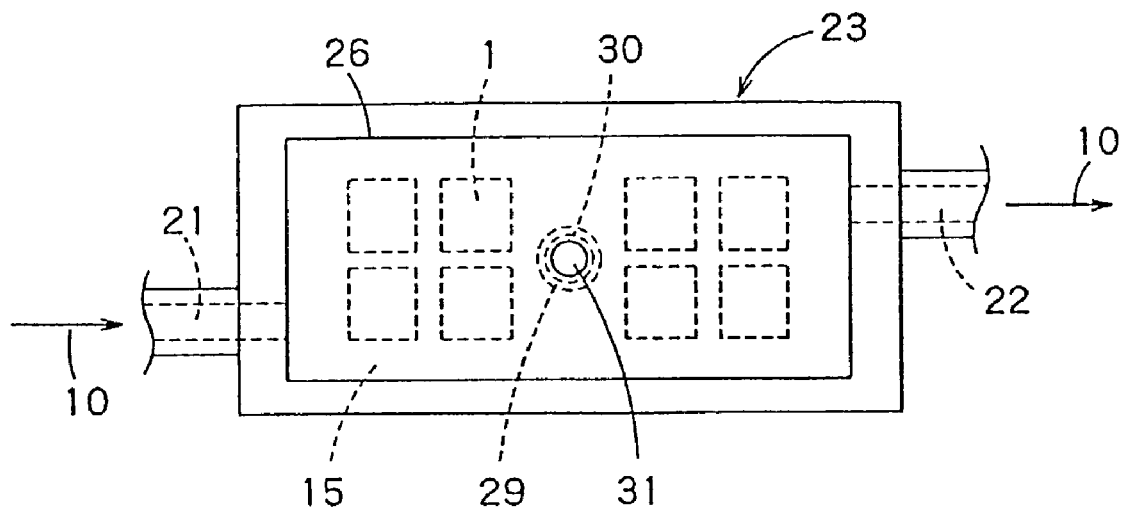
FIG. 12A and FIG. 12B are views given in explanation of the construction of an eighth embodiment of the present invention, FIG. 12A being a plan view and FIG. 12B a vertical cross-sectional view.
Figure 12B:
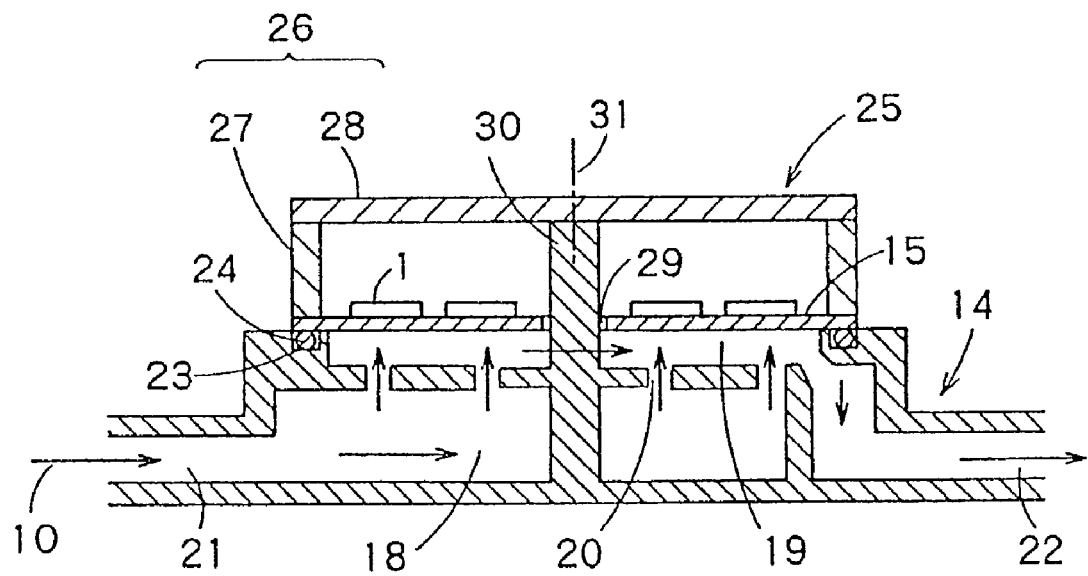

FIG. 12A and FIG. 12B are views given in explanation of the construction of an eighth embodiment of the present invention, FIG. 12A being a plan view and FIG. 12B a vertical cross-sectional view. Module type element 25 in this embodiment is provided with a cover member 26 comprising a cylindrical body 27 and cover 28. A hole 29 is formed in the middle of plate member 15 and a mounting boss 30 formed in the middle of heat sink 14 passes through this hole 29. Thus, when cover 28 is tightened onto mounting boss 30 by tightening screw 31, the end face of cylindrical body 27 is subjected to pressing force onto plate member 15 by this tightening force. O-ring 24 therefore assumes a condition in which it is compressed against the back face side of plate member 15.

With this eighth embodiment, since sufficient pressing force can be supplied to O-ring 24 by a single tightening screw 31, the task of assembly can be conducted in a straightforward fashion, improving efficiency of the assembly task.

Figure 13A:
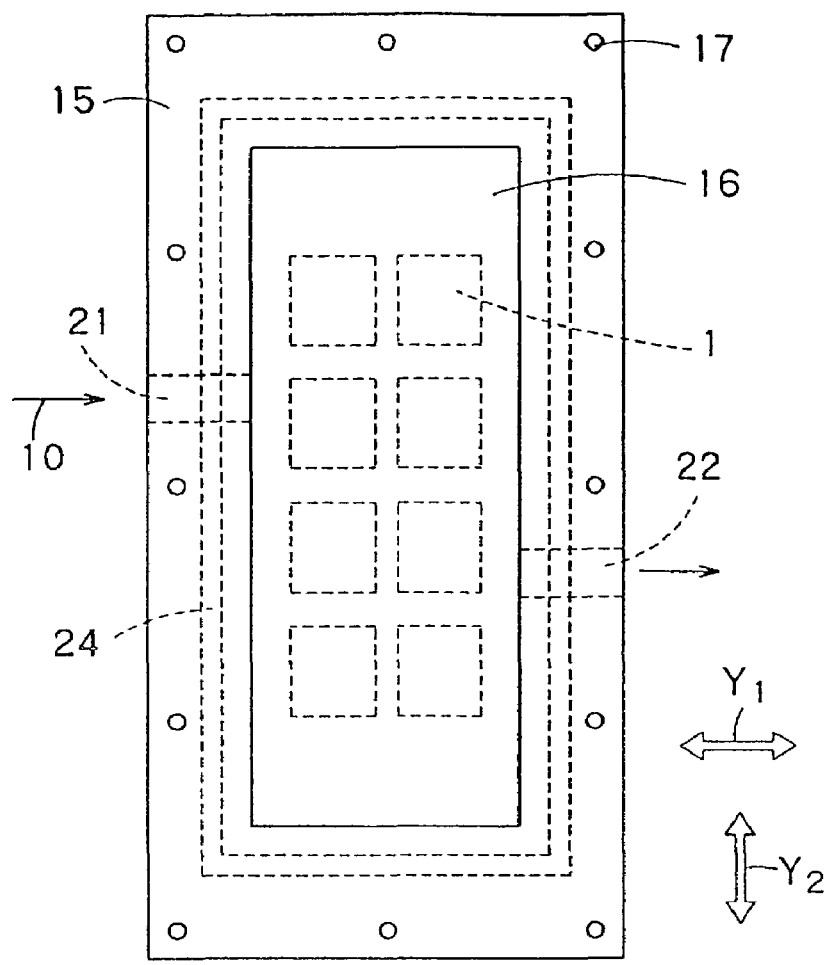
FIG. 13A and FIG. 13B are views given in explanation of the construction of a ninth embodiment of the present invention, FIG. 13A being a plan view and FIG. 13B a vertical cross-sectional view.
Figure 13B:
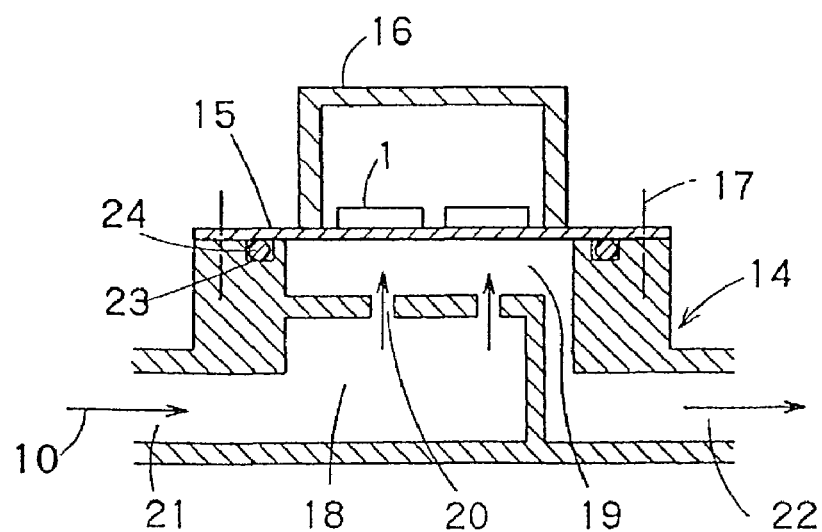

FIG. 13A and FIG. 13B are views given in explanation of the construction of a ninth embodiment of the present invention, FIG. 13A being a plan view and FIG. 13B a vertical cross-sectional view. The construction of FIG. 13A and FIG. 13B is the same as the construction of FIG. 10A and FIG. 10B, but the direction of mounting of coolant inlet 21 and coolant outlet 22 are different.

Specifically, as shown in FIG. 13A, the planar shape of the region of arrangement of the entirety of heat-generating elements 1 is practically rectangular and the planar shape of coolant contact chamber 19 and coolant introduction chamber 18 corresponding thereto is also practically rectangular. If the direction perpendicular to the long side of this rectangle is taken as the Y1 direction and the direction parallel thereto as the Y2 direction, the direction of mounting coolant inlet 21 and coolant outlet 22 in this embodiment is the Y1 direction whereas the direction of mounting of coolant inlet 21 and coolant outlet 22 in the sixth embodiment shown in FIG. 13A is the Y2 direction.

Thus, by making the mounting direction of coolant inlet 21 and coolant outlet 22 the Y1 direction which is perpendicular to the long side, the thermal resistance from the coolant to the heat-generating elements 1 is reduced, making it possible to increase the heat transfer factor. The reason for this is that the ratio of interference of the coolant after injection from the upstream nozzles with the jets injected from the downstream nozzles is much smaller in the case of the Y1 direction than in the case of the Y2 direction.

Figure 14:
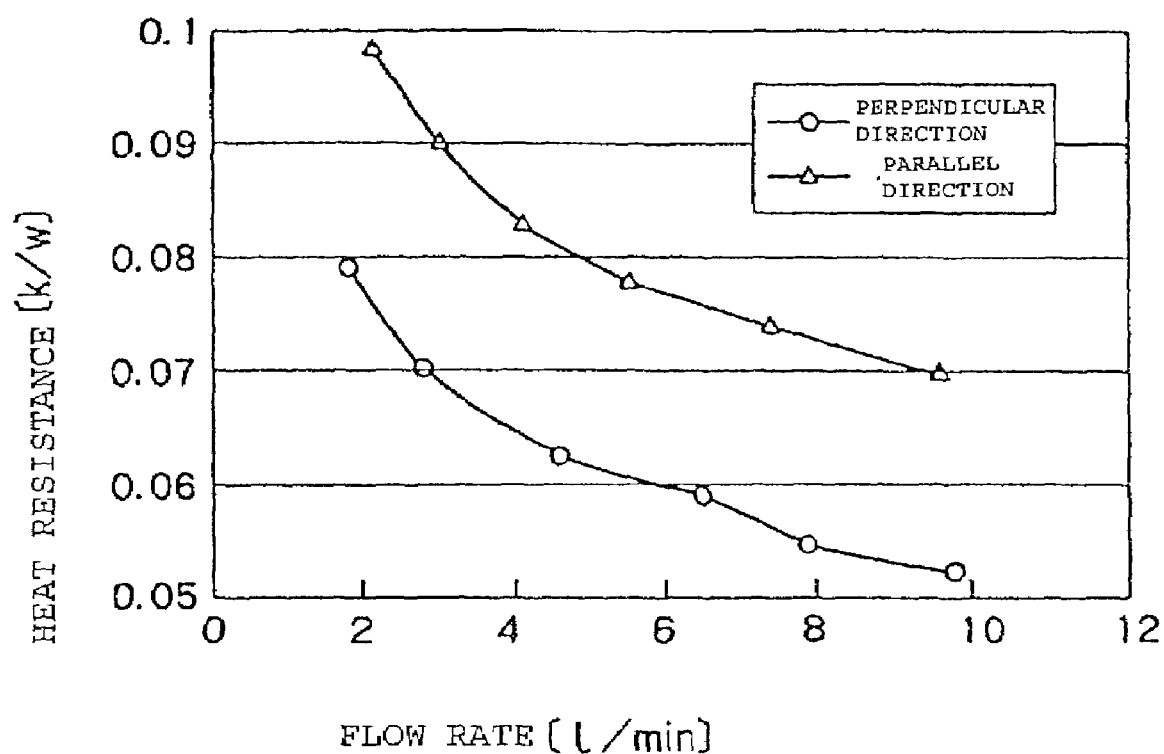
FIG. 14 is a thermal resistance-flow rate characteristic for the case where the direction of mounting coolant inlet 21 and coolant outlet 22 is a direction perpendicular to the long side of a practically (substantially) rectangular region of arrangement and for the case where this direction is a direction parallel thereto.

FIG. 14 is a thermal resistance/flow rate characteristic for the case where the direction of mounting coolant inlet 21 and coolant outlet 22 is a direction perpendicular to the long side and for the case where this direction is a direction parallel thereto. As can be seen from this Figure, the thermal resistance is appreciably less in the case where the mounting direction is the perpendicular direction.

Figure 15B:
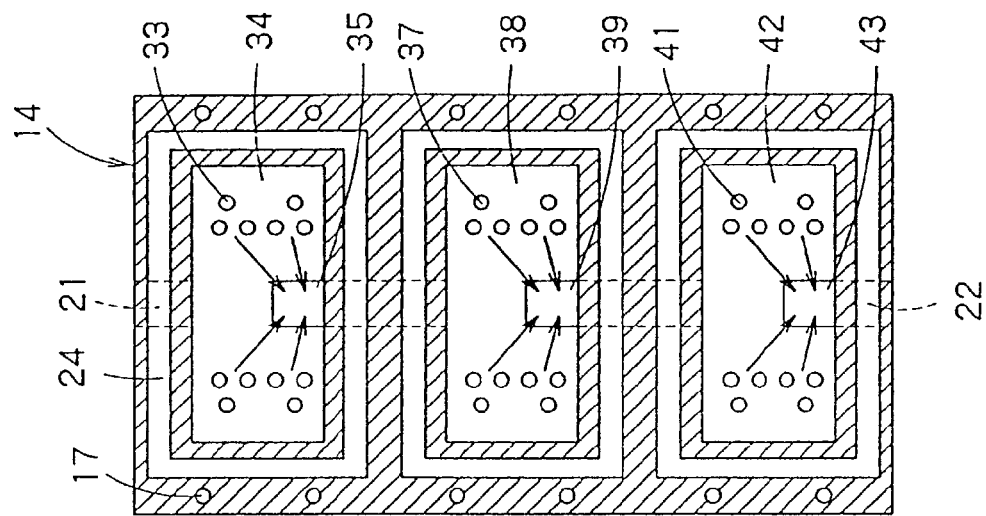
FIG. 15A and FIG. 15B are views given in explanation of the construction of a tenth embodiment of the present invention, FIG. 15A being a lateral cross-sectional view and FIG. 15B being a view in the direction of the arrows B4—B4 of FIG. 15A.
Figure 15A:
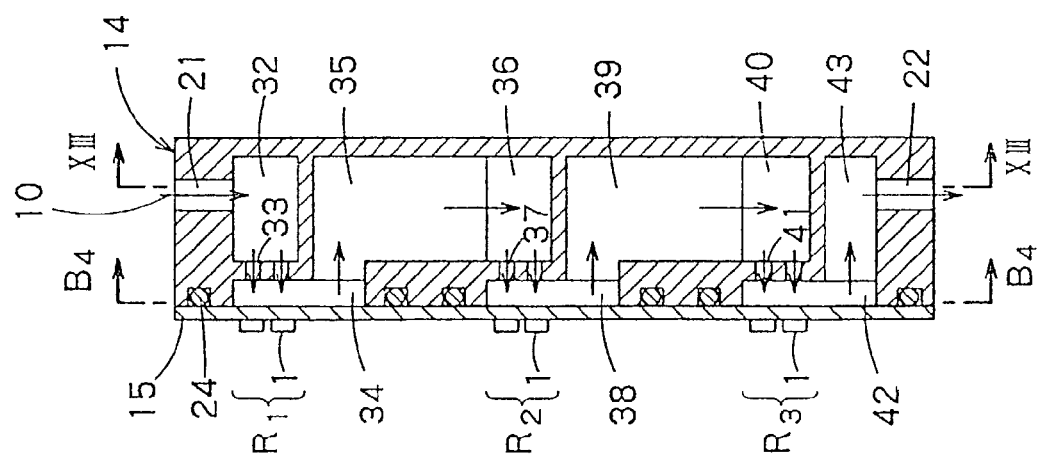
Figure 16:
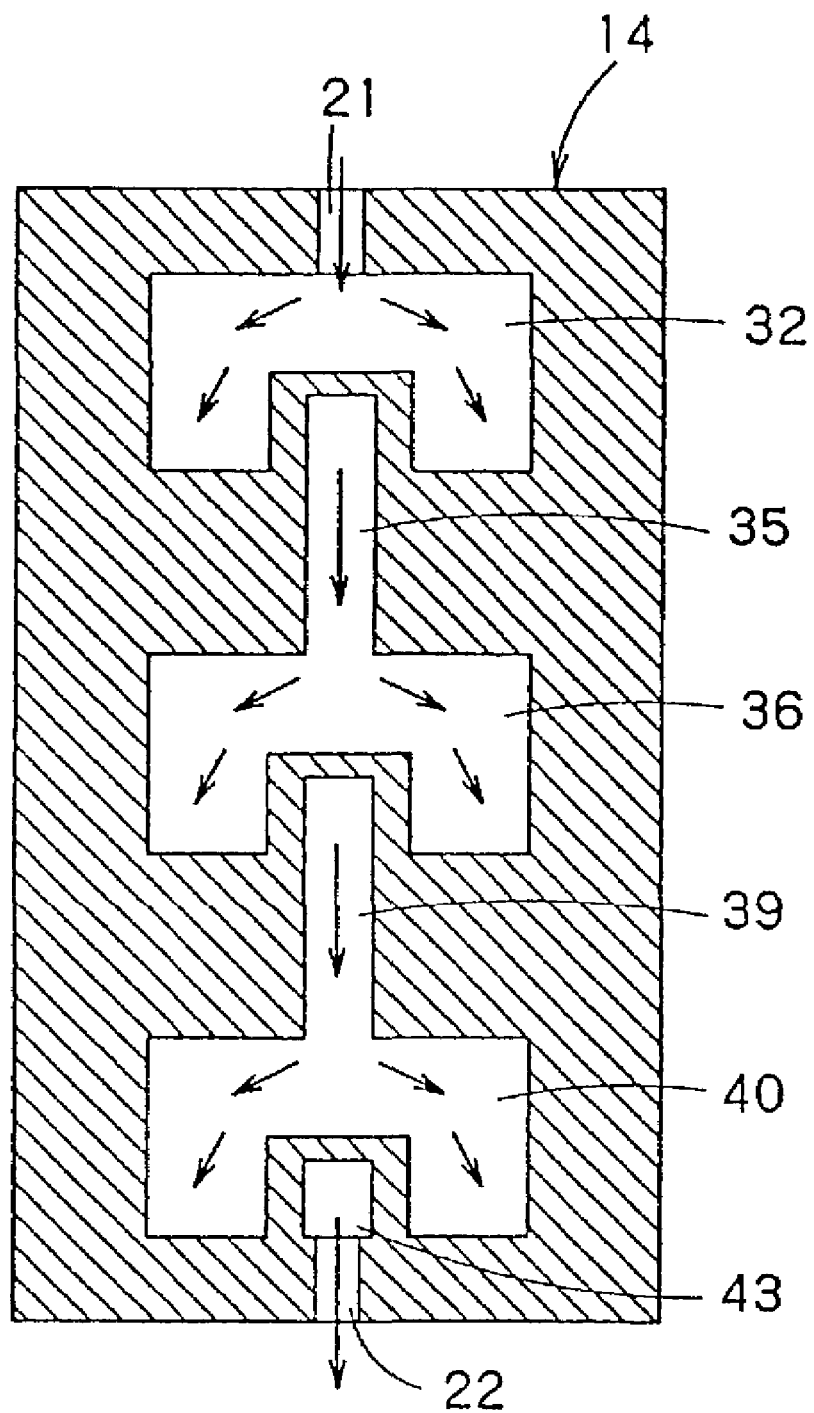
FIG. 16 is a view in the direction of the arrows XIII—XIII of FIG. 15A.

FIG. 15A and FIG. 15B are views given in explanation of the construction of a tenth embodiment of the present invention, FIG. 15A being a lateral cross-sectional view and FIG. 15B being a view in the direction of the arrows B4—B4 of FIG. 15A. Also, FIG. 16 is a view in the direction of the arrows XIII—XIII of FIG. 15A. As shown in FIG. 15A, in this embodiment, the region of arrangement of heat-generating elements 1 is divided into first to third arrangement regions R1 to R3.

This embodiment is therefore suitable when a large number of heat-generating elements 1 are to be cooled.

Coolant from coolant inlet 21 is introduced into coolant introduction chamber 32 and coolant within coolant introduction chamber 32 is fed into first coolant contact chamber 34 by being injected from nozzles 33; cooling of heat-generating elements 1 is effected by collision of the coolant with the back face side of plate member 15. As shown in FIG. 16, coolant introduction chamber 32 constitutes a wide space having an approximately inverted channel-shaped cross section.

The coolant within first coolant contact chamber 34 is fed into first intermediate introduction chamber 36 through a narrow passage 35. As shown in FIG. 16, this first intermediate introduction chamber 36 also has a space having the same shape as coolant introduction chamber 32. The coolant within this intermediate introduction chamber 36 is fed into second coolant contact chamber 38 by being injected from nozzles 37 and cooling of heat-generating elements 1 is effected by collision of the coolant with the back face side of plate member 15.

The coolant within second coolant contact chamber 38 is fed into a second intermediate introduction chamber 40 through passage 39 and the coolant within second intermediate chamber 40 is fed into a third coolant contact chamber 42 by being injected from nozzles 41; cooling of heat-generating elements 1 is effected by collision of the coolant with the back face side of plate member 15.

The coolant within third coolant contact chamber 42 then passes through a narrow passage 43 and flows to outside heat sink 14 through coolant outlet 22.

Thus, in this embodiment, first to third coolant contact chambers 34, 38, 42 are provided respectively corresponding to first to third arrangement regions R1 to R3 and, in addition, a first intermediate introduction chamber 36 is provided between first coolant contact chamber 34 and second coolant contact chamber 38 while a second coolant introduction chamber 40 is provided between second coolant contact chamber 38 and third coolant contact chamber 42. Consequently, mutual interference of jets of coolant injected from nozzles 33, 37 and 41 is prevented, making it possible to achieve a smooth flow of coolant and thereby making it possible to improve the efficiency of cooling.

It should be noted that, although, in this embodiment, the case where there are three regions of arrangement of heat-generating elements 1 i.e. where there are three coolant contact chambers and two intermediate introduction chambers was described, in general it could be applied where, if the number of arrangement regions is N (where N is an integer of 2 or more) i.e. if the number of coolant contact chambers is N, the number of intermediate introduction chambers is N−1.

As described above, with the present invention, a construction is adopted wherein two types of chambers are provided in the heat sink, namely, coolant introduction chambers and coolant contact chambers and nozzles that inject coolant towards the back face side of the heat-generating elements are provided between these chambers, so, even transiently, uniform cooling by the coolant can be achieved, making it possible to prevent application of large thermal stress to the heat-generating elements.

Obviously, numerous additional modifications and variations of the present invention are possible in light of the above teachings. It is therefore to be understood that within the scope of the appended claims, the present invention may be practiced otherwise than as specially described herein.

What is claimed is:

1. A cooling device for heat-generating elements comprising:
   (1) a surface section wherein a plurality of heat-generating elements are arranged in a substantially radial manner; and
   (2) a heat sink that performs cooling of said heat-generating elements by flow of coolant in a coolant passage formed in an interior of said surface section;
   wherein said heat sink comprises:
      (a) a coolant introduction chamber which introduces coolant from a coolant inlet formed in said coolant passage;
      (b) a coolant contact chamber (i) formed in said coolant passage and (ii) configured to permit coolant from said coolant introduction chamber into contact with back face of a surface on which said heat-generating elements are arranged; and
      (c) a nozzle for injecting said coolant towards said back face side, between said coolant introduction chamber and said coolant contact chamber which is adjacent to the coolant introduction chamber;
   said coolant introduction chamber is formed at said back face side of said heat-generating elements arranged in or substantially in a middle portion of said back face side;
   said coolant contact chamber comprises a first coolant contact chamber formed so as to surround said coolant introduction chamber in a direction of said face where said heat-generating elements are arranged;
   at least one additional coolant contact chamber, formed surrounding and in fluid communication with said first coolant contact chamber;
   a nozzle formed between said coolant introduction chamber and said first coolant contact chamber, said nozzle being a single central nozzle formed in a central position within said chambers; and
   a plurality of nozzles for injecting said coolant towards said back face side being formed between said at least one additional coolant contact chamber, said plurality of nozzles being peripheral nozzles formed so as to be positioned in radial fashion about said central nozzle as center;
   wherein the diameter of nozzles other than the single central nozzle decreases as the distance from the single central nozzle increases.

2. A cooling device for heat generating elements comprising:
   a heat sink comprising a first front surface and a first back surface opposite the first front surface;
   a plurality of heat generating elements arranged in a pattern on the first front surface of the heat sink;
   a first coolant contact chamber arranged on the first back surface of the heat sink;

a coolant introduction chamber located at least partially within the first coolant contact chamber;

a first nozzle providing fluid communication between the coolant introduction chamber and the first coolant contact chamber, the first nozzle having a first diameter and being configured to direct fluid toward the first back surface of the beat sink a second coolant contact chamber which at least partially surrounds the first coolant contact chamber; and a plurality of second nozzles wherein the second nozzles:
  (i) are positioned in a radial fashion around the first nozzle,
  (ii) are arranged between the first coolant contact chamber and the second coolant contact chamber, and
  (iii) are configured to provide for radial flow of coolant away from the first nozzle.

3. A cooling device according to claim 2, wherein each of the second nozzles are configured to direct fluid toward the first back surface of the heat sink.

4. A cooling device according to claim 3, wherein the second coolant chamber is arranged around the first nozzle.

5. A cooling device according to claim 3, wherein the diameter of each nozzle of the plurality of second nozzles is less than the first diameter of the first nozzle.

6. A cooling device according to claim 2, further comprising:
  a third coolant contact chamber which at least partially surrounds the second coolant contact chamber; and
  a plurality of third nozzles arranged between the third coolant contact chamber and the second coolant contact chamber and providing fluid communication between the third coolant contact chamber and the second coolant contact chamber, each of the third nozzles being configured to direct fluid toward the first back surface of the heat sink.

7. A cooling device according to claim 6, wherein the diameter of each nozzle of the plurality of third nozzles is less than the diameter of at least one nozzle of the plurality of second nozzles.

8. A cooling device according to claim 6, wherein the plurality of third nozzles are arranged around the plurality of second nozzles.

9. A cooling device according to claim 2, wherein the plurality of second nozzles are arranged around the first nozzle and the plurality of third nozzles are arranged around the plurality of second nozzles.

10. A cooling device according to claim 9, wherein the diameter of nozzles other than the first nozzle decreases as the distance from the first nozzle increases.

11. A waling device according to claim 2, further comprising:
  a coolant inlet; and
  a passage providing fluid communication between the coolant inlet and the coolant introduction chamber.

12. A cooling device according to claim 2, further comprising:

a second front surface and a second back surface opposite the second front surface;

a plurality of heat generating elements arranged in a pattern on the second front surface of the heat sink;

a first coolant contact chamber arranged on the second back surface of the heat sink;

a coolant introduction chamber located at least partially within the first coolant contact chamber arranged on the second back surface of the heat sink;

a first nozzle providing fluid communication between the coolant introduction chamber and the first coolant contact chamber, the first nozzle having a first diameter and being configured to direct fluid toward the back surface of the second heat sink wherein the first back surface and the second back surface of the heat sink face each other and define an interior region of the heat sink.

13. A cooling device according to claim 12, further comprising:
  a coolant inlet; and
  a passage providing fluid communication between the coolant inlet and the coolant introduction chamber.

14. A cooling device according to claim 12, further comprising:
  a plurality of coolant inlets; and
  a plurality of passages, each of which provides fluid communication between a coolant inlet and a coolant introduction chamber.

15. A cooling device according to claim 12, further comprising:
  two coolant inlets; and
  two passages, each passage providing fluid communication between one of the two coolant inlets and a coolant introduction chamber;
  wherein the two passages are arranged in offset positions with respect to each other.

16. A cooling device according to claim 12, further comprising:
  a first coolant inlet and a first passage providing fluid communication between the first coolant inlet and the coolant introduction chamber located at least partially within the first coolant contact chamber which coolant contact chamber is arranged on the first back surface of the heat sink; and
  a second coolant inlet and a second passage providing fluid communication between the second coolant inlet and the coolant introduction chamber located at least partially within the first coolant contact chamber which coolant contact chamber is arranged on the second back surface of the heat sink;
  wherein the first passage and the second passage are separated from each other by a partition.

17. A cooling device according to claim 16, wherein the partition is arranged at an angle with respect to a flow path of fluid through both the first passage and the second passage.

* * * * *